US011419213B2

(12) United States Patent
Nishiyama et al.

(10) Patent No.: US 11,419,213 B2
(45) Date of Patent: Aug. 16, 2022

(54) MULTILAYER FLEX CIRCUIT WITH NON-PLATED OUTER METAL LAYER

(71) Applicant: Western Digital Technologies, Inc., San Jose, CA (US)

(72) Inventors: Nobumasa Nishiyama, Yokohama (JP); Teruhiro Nakamiya, Tokyo (JP); Satoshi Nakamura, Yokohama (JP); Hiroshi Matsuda, Yokohama (JP)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 8 days.

(21) Appl. No.: 16/824,269

(22) Filed: Mar. 19, 2020

(65) Prior Publication Data

US 2020/0315014 A1    Oct. 1, 2020

Related U.S. Application Data

(60) Provisional application No. 62/823,971, filed on Mar. 26, 2019.

(51) Int. Cl.
*H05K 1/00* (2006.01)
*H05K 1/02* (2006.01)
(Continued)

(52) U.S. Cl.
CPC ............. *H05K 1/14* (2013.01); *G11B 5/4846* (2013.01); *H05K 1/112* (2013.01); *H05K 1/118* (2013.01);
(Continued)

(58) Field of Classification Search
CPC .. H05K 1/00; H05K 1/02; H05K 1/03; H05K 1/09; H05K 1/11; H05K 1/14; H05K 1/112; H05K 1/118; H05K 3/32; H05K 3/36; H05K 3/38; H05K 3/40; H05K 3/46; H05K 3/365; H05K 3/421; H01L 21/20; H01L 23/00; H01L 23/48
USPC ............ 361/751, 769, 792, 803; 174/117 A, 174/117 R, 250, 251, 254, 255, 257, 261, 174/262; 257/779; 156/60, 235, 250, 156/251, 257, 297
See application file for complete search history.

(56) References Cited

U.S. PATENT DOCUMENTS

4,659,872 A * 4/1987 Dery ..................... H01R 4/04
                                                174/117 A
4,872,934 A * 10/1989 Kameda ................ B32B 38/10
                                                156/250
(Continued)

*Primary Examiner* — Xiaoliang Chen
(74) *Attorney, Agent, or Firm* — Kunzler Bean & Adamson (57) ABSTRACT

Described herein is a multilayer flex circuit having a first dual flex circuit and a second dual flex circuit where each one comprises an outer metal layer, a base insulation layer, and an inner metal layer. The base insulation layer is disposed between the outer metal layer and the inner metal layer. The inner metal layer of the first dual flex circuit is configured to face toward the inner metal layer of the second dual flex circuit. The multilayer flex circuit also includes a coupling layer that adhesively couples the inner metal layer of the first dual flex circuit to the inner metal layer of the second dual flex circuit. The multilayer flex circuit also comprises an electrically conductive material that electrically connects the inner metal layer of the second dual flex circuit to the inner metal layer of the first dual flex circuit.

20 Claims, 7 Drawing Sheets

(51) Int. Cl.
*H05K 1/03* (2006.01)
*H05K 1/09* (2006.01)
*H05K 1/11* (2006.01)
*H05K 1/14* (2006.01)
*H05K 3/32* (2006.01)
*H05K 3/36* (2006.01)
*H05K 3/38* (2006.01)
*H05K 3/40* (2006.01)
*H05K 3/46* (2006.01)
*H01L 21/20* (2006.01)
*H01L 23/00* (2006.01)
*H01L 23/48* (2006.01)
*H05K 3/42* (2006.01)
*G11B 5/48* (2006.01)

(52) U.S. Cl.
CPC .......... *H05K 3/365* (2013.01); *H05K 3/421* (2013.01); *H05K 2201/0367* (2013.01)

(56) References Cited

U.S. PATENT DOCUMENTS

| | | | | |
|---|---|---|---|---|
| 5,072,074 A * | 12/1991 | DeMaso | ............. | H05K 3/4691 174/254 |
| 5,428,190 A * | 6/1995 | Stopperan | ............. | H05K 3/323 174/250 |
| 5,527,998 A * | 6/1996 | Anderson | ............. | H05K 3/361 174/254 |
| 5,617,865 A * | 4/1997 | Palczewska | .......... | B06B 1/0622 29/25.35 |
| 5,719,749 A * | 2/1998 | Stopperan | ............. | H05K 1/141 174/254 |
| 5,800,650 A * | 9/1998 | Anderson | ............. | H05K 3/361 156/150 |
| 6,972,966 B1 * | 12/2005 | Oishi | .................... | H05K 1/141 361/803 |
| 8,789,272 B2 * | 7/2014 | Rathburn | ............. | H05K 7/1061 29/846 |
| 10,159,154 B2 * | 12/2018 | Rathburn | ............. | C23C 18/1689 |
| 2005/0205291 A1 * | 9/2005 | Yamashita | ............... | H05K 3/20 174/254 |
| 2006/0154434 A1 * | 7/2006 | Das | ........................ | H05K 1/162 438/393 |
| 2007/0170598 A1 * | 7/2007 | Iijima | .................. | H05K 3/4617 257/779 |
| 2008/0311358 A1 * | 12/2008 | Tomii | ..................... | B32B 27/12 428/201 |
| 2009/0107706 A1 * | 4/2009 | Lee | ....................... | H05K 3/4641 174/255 |
| 2009/0133906 A1 * | 5/2009 | Baek | ................... | H05K 1/0218 174/254 |
| 2011/0094776 A1 * | 4/2011 | Lee | ....................... | H05K 1/0278 174/254 |
| 2011/0214906 A1 * | 9/2011 | Baars | ....................... | H05K 1/00 174/257 |
| 2012/0049877 A1 * | 3/2012 | Rathburn | ............. | G01R 1/0466 324/756.02 |
| 2013/0089658 A1 * | 4/2013 | Matsuda | ............... | B23K 26/0622 427/97.8 |
| 2013/0153269 A1 * | 6/2013 | Takahashi | .............. | H05K 1/115 174/254 |
| 2015/0027754 A1 * | 1/2015 | Shimoda | ............... | C08G 73/1042 174/251 |
| 2016/0345431 A1 * | 11/2016 | Lee | ..................... | H05K 1/0278 |
| 2017/0280554 A1 * | 9/2017 | Toyoshima | ........... | H05K 3/4655 |
| 2018/0141311 A1 * | 5/2018 | Ozeki | .................... | B32B 27/34 |
| 2019/0295982 A1 * | 9/2019 | Hu | ........................... | H01L 23/12 |

\* cited by examiner

MULTILAYER FLEX CIRCUIT WITH NON-PLATED OUTER METAL LAYER

CROSS-REFERENCE TO RELATED APPLICATION

This application claims the benefit of U.S. Provisional Patent Application No. 62/823,971, filed Mar. 26, 2019, which is incorporated herein by reference in its entirety.

FIELD

This disclosure relates generally to flexible printed circuits and more particularly to multilayer flex circuits with a non-plated outer metal layer.

BACKGROUND

Some advanced electronic devices such as hard disk drives use multilayered flexible printed circuits to provide connections between electronic components. For example, an integrated lead suspension ("ILS") or head gimbal assembly ("HGA") uses flexible printed circuits to provide multiple connections between a magnetic recording head and hard disk drives. Dual layer flex circuits have flexible copper traces printed on both sides of flexible base insulator. As technology advances, the complexity and density of integrated circuits designed to be mounted on flexible printed circuits generally increases. At the same time, miniaturization of circuits and mechanical components also progresses, thus, the number and density of connections needed to be carried by flexible printed circuits likewise increases.

In some conventional examples, dual layer flex circuits are created by first laminating one or more copper layers. After the copper layers are laminated, through-hole vias are made and copper layers are connected through the through-hole vias by copper plating. Then, the specific circuit paths are formed by etching away any copper not intended to form part of the circuit. Conventional through-hole plating processes, used to create vias between metal layers, cause the top/outer layer to become thicker because of the plating.

However, in some applications, the outer metal layer is the layer to which certain high-bump-density components need to connect using fine-pitch interconnects e.g., traces. For example, some preamps for signals from a magnetic read head for hard disk drives are mounted to the top copper layer of a flex circuit, which needs fine-pitch interconnects because of the large number of solder bumps needed to connect the preamp to various traces of the circuit.

SUMMARY

The originators of the subject matter of the present application have discerned a need for a flexible printed circuit structure for use in connector assemblies, such as, for example, integrated lead suspension flexures or flex circuits for electrically connecting a controller and a head gimbal assembly HGA, that overcome the shortcomings of prior art connection assemblies.

The subject matter of the present application has been developed in response to the present state of the art, and, in particular, in response to the problems and needs of conventional hard disk drives, such as the shortcomings of using conventional through-hole connections with the corresponding plating and etching processes for flexible printed circuits that require numerous solder bumps and/or fine-pitch interconnects, e.g., traces. In view of the foregoing, the subject matter of the present application has been developed to provide a multilayer flexible printed circuit that overcomes many of the shortcomings of the conventional through-hole connections.

Described herein is a multilayer flex circuit having a first dual flex circuit and a second dual flex circuit. Each one of the first dual flex circuit and the second dual flex circuit comprises an outer metal layer, a base insulation layer, and an inner metal layer. The base insulation layer is disposed between the outer metal layer and the inner metal layer. The inner metal layer of the first dual flex circuit is configured to face toward the inner metal layer of the second dual flex circuit. The multilayer flex circuit also includes a coupling layer that adhesively couples the inner metal layer of the first dual flex circuit to the inner metal layer of the second dual flex circuit. The multilayer flex circuit also comprises an electrically conductive material that electrically connects the inner metal layer of the second dual flex circuit to the inner metal layer of the first dual flex circuit. The preceding subject matter of this paragraph characterizes example 1 of the present disclosure.

The outer metal layer of the first dual flex circuit is non-plated and comprises fine-pitch interconnects. The preceding subject matter of this paragraph characterizes example 2 of the present disclosure, wherein example 2 also includes the subject matter according to example 1, above.

The outer metal layer of the first dual flex circuit comprises one or more hole-free surfaces configured to electrically connect to the second dual flex circuit through the coupling layer. The preceding subject matter of this paragraph characterizes example 3 of the present disclosure, wherein example 3 also includes the subject matter according to any one of examples 1-2, above.

The one or more hole-free surfaces are further configured to directly electrically connect to one or more solder bumps. The preceding subject matter of this paragraph characterizes example 4 of the present disclosure, wherein example 4 also includes the subject matter according to example 3, above.

The one or more hole-free surfaces are configured to electrically connect to one or more buried vias. The preceding subject matter of this paragraph characterizes example 5 of the present disclosure, wherein example 5 also includes the subject matter according to any one of examples 3-4, above.

The coupling layer comprises an electrically conductive material that is disposed substantially in parallel to the inner metal layer of the first dual flex circuit and to the inner metal layer of the second dual flex circuit. The preceding subject matter of this paragraph characterizes example 6 of the present disclosure, wherein example 6 also includes the subject matter according to example 5, above.

The multilayer flex circuit further comprises one or more inner bumps that extend from the electrically conductive material of the coupling layer at least partially into the one or more buried vias. The preceding subject matter of this paragraph characterizes example 7 of the present disclosure, wherein example 7 also includes the subject matter according to any one of examples 5-6, above.

The coupling layer comprises a non-conductive adhesive. The inner metal layer of the first dual flex circuit is electrically connected to the inner metal layer of the second dual flex circuit by electrically conductive material that extends through the non-conductive adhesive of the coupling layer. The preceding subject matter of this paragraph characterizes example 8 of the present disclosure, wherein example 8 also includes the subject matter according to any one of examples 2-7, above.

The multilayer flex circuit further comprises one or more blind vias that electrically connect the outer metal layer and the inner metal layer of the second dual flex circuit to the inner metal layer of the first dual flex circuit. The preceding subject matter of this paragraph characterizes example 9 of the present disclosure, wherein example 9 also includes the subject matter according to example 8, above.

The multilayer flex circuit further comprises a through-hole via that electrically connects the outer metal layer of the second dual flex circuit to the inner metal layer of the second dual flex circuit. The multilayer flex circuit also comprises a blind via that extends from the through-hole via and electrically connects the inner metal layer of the second dual flex circuit to the inner metal layer of the first dual flex circuit. The preceding subject matter of this paragraph characterizes example 10 of the present disclosure, wherein example 10 also includes the subject matter according to any one of examples 8-9, above.

The electrically conductive material adhesively couples the first dual flex circuit to the second dual flex circuit. The preceding subject matter of this paragraph characterizes example 11 of the present disclosure, wherein example 11 also includes the subject matter according to any one of examples 1-10, above.

The first dual flex circuit and the second dual flex circuit individually further comprise an inner insulation layer coupled to the inner metal layer. The preceding subject matter of this paragraph characterizes example 12 of the present disclosure, wherein example 12 also includes the subject matter according to any one of examples 1-11, above.

The electrically conductive material comprises one or more of an aluminum sheet, an anisotropic conductive film, and a conductive adhesive. The preceding subject matter of this paragraph characterizes example 13 of the present disclosure, wherein example 13 also includes the subject matter according to any one of examples 1-12, above.

The outer metal layer and the inner metal layer of the first dual flex circuit and the second dual flex circuit comprise one or more of copper, nickel, and silver. The preceding subject matter of this paragraph characterizes example 14 of the present disclosure, wherein example 14 also includes the subject matter according to any one of examples 1-13, above.

The base insulation layer of the first dual flex circuit and the second dual flex circuit comprises one or more of polyimide, polyether ether ketone, polyester, polyethylene terephthalate, and flexible silicon. The preceding subject matter of this paragraph characterizes example 15 of the present disclosure, wherein example 15 also includes the subject matter according to any one of examples 1-14, above.

A method is also described herein that comprises providing a first dual flex circuit and a second dual flex circuit that individually include an outer metal layer. The outer metal layer of the first dual flex circuit is non-plated, an inner metal layer for connecting to another dual flex circuit, and a base insulation layer disposed between the outer metal layer and the inner metal layer. The method further includes configuring the inner metal layer of the first dual flex circuit to face toward the inner metal layer of the second dual flex circuit and adhesively coupling the inner metal layer of first dual flex circuit to the inner metal layer of the second dual flex circuit. The method also includes establishing an electrical connection between the inner metal layer of the second dual flex circuit and the inner metal layer of the first dual flex circuit. The preceding subject matter of this paragraph characterizes example 16 of the present disclosure.

Establishing the electrical connection comprises adhesively coupling the inner metal layer of the first dual flex circuit to the inner metal layer of the second dual flex circuit using an electronically conductive material. The preceding subject matter of this paragraph characterizes example 17 of the present disclosure, wherein example 17 also includes the subject matter according to example 16, above.

Establishing the electrical connection comprises creating a plated blind via that connects the outer metal layer and the inner metal layer of the second dual flex circuit to the inner metal layer of the first dual flex circuit. The preceding subject matter of this paragraph characterizes example 18 of the present disclosure, wherein example 18 also includes the subject matter according to any one of examples 16-17, above.

Establishing the electrical connection comprises creating a through-hole via that connects the outer metal layer and the inner metal layer of the second dual flex circuit and creating a blind via that connects the inner metal layer of the second dual flex circuit to the inner metal layer of the first dual flex circuit. The preceding subject matter of this paragraph characterizes example 19 of the present disclosure, wherein example 19 also includes the subject matter according to any one of examples 16-18, above.

A storage device is described herein that includes a multilayer flex circuit. The multilayer flex circuit includes a first dual flex circuit and a second dual flex circuit. The first dual flex circuit and the second dual flex circuit individually have an outer metal layer, where the outer metal layer of the first dual flex circuit is non-plated, a base insulation layer, an inner metal layer, where the base insulation layer is disposed between the outer metal layer and the inner metal layer, and where the inner metal layer of the first dual flex circuit is configured to face toward the inner metal layer of the second dual flex circuit. The multilayer flex circuit also includes a coupling layer that adhesively couples the inner metal layer of the first dual flex circuit to the inner metal layer of the second dual flex circuit. The multilayer flex circuit additionally includes an electrically conductive material that electrically connects the inner metal layers of the second dual flex circuit to the inner metal layer of the first dual flex circuit. The preceding subject matter of this paragraph characterizes example 20 of the present disclosure.

The described features, structures, advantages, and/or characteristics of the subject matter of the present disclosure may be combined in any suitable manner in one or more examples and/or implementations. In the following description, numerous specific details are provided to impart a thorough understanding of examples of the subject matter of the present disclosure. One skilled in the relevant art will recognize that the subject matter of the present disclosure may be practiced without one or more of the specific features, details, components, materials, and/or methods of a particular example or implementation. In other instances, additional features and advantages may be recognized in certain examples and/or implementations that may not be present in all examples or implementations. Further, in some instances, well-known structures, materials, or operations are not shown or described in detail to avoid obscuring aspects of the subject matter of the present disclosure. The features and advantages of the subject matter of the present disclosure will become more fully apparent from the following description and appended numbered paragraphs, or may be learned by the practice of the subject matter as set forth hereinafter.

BRIEF DESCRIPTION OF THE DRAWINGS

In order that the advantages of the disclosure will be readily understood, a more particular description of the disclosure briefly described above will be rendered by reference to specific examples that are illustrated in the appended drawings. Understanding that these drawings depict only typical examples of the disclosure and are not therefore to be considered to be limiting of its scope, the subject matter of the present application will be described and explained with additional specificity and detail through the use of the accompanying drawings, in which.

DETAILED DESCRIPTION

Reference throughout this specification to "one example," "an example," or similar language means that a particular feature, structure, or characteristic described in connection with the example is included in at least one example of the present disclosure. Appearances of the phrases "in one example," "in an example," and similar language throughout this specification may, but do not necessarily, all refer to the same example. Similarly, the use of the term "implementation" means an implementation having a particular feature, structure, or characteristic described in connection with one or more examples of the present disclosure, however, absent an express correlation to indicate otherwise, an implementation may be associated with one or more examples.

Figure 1:
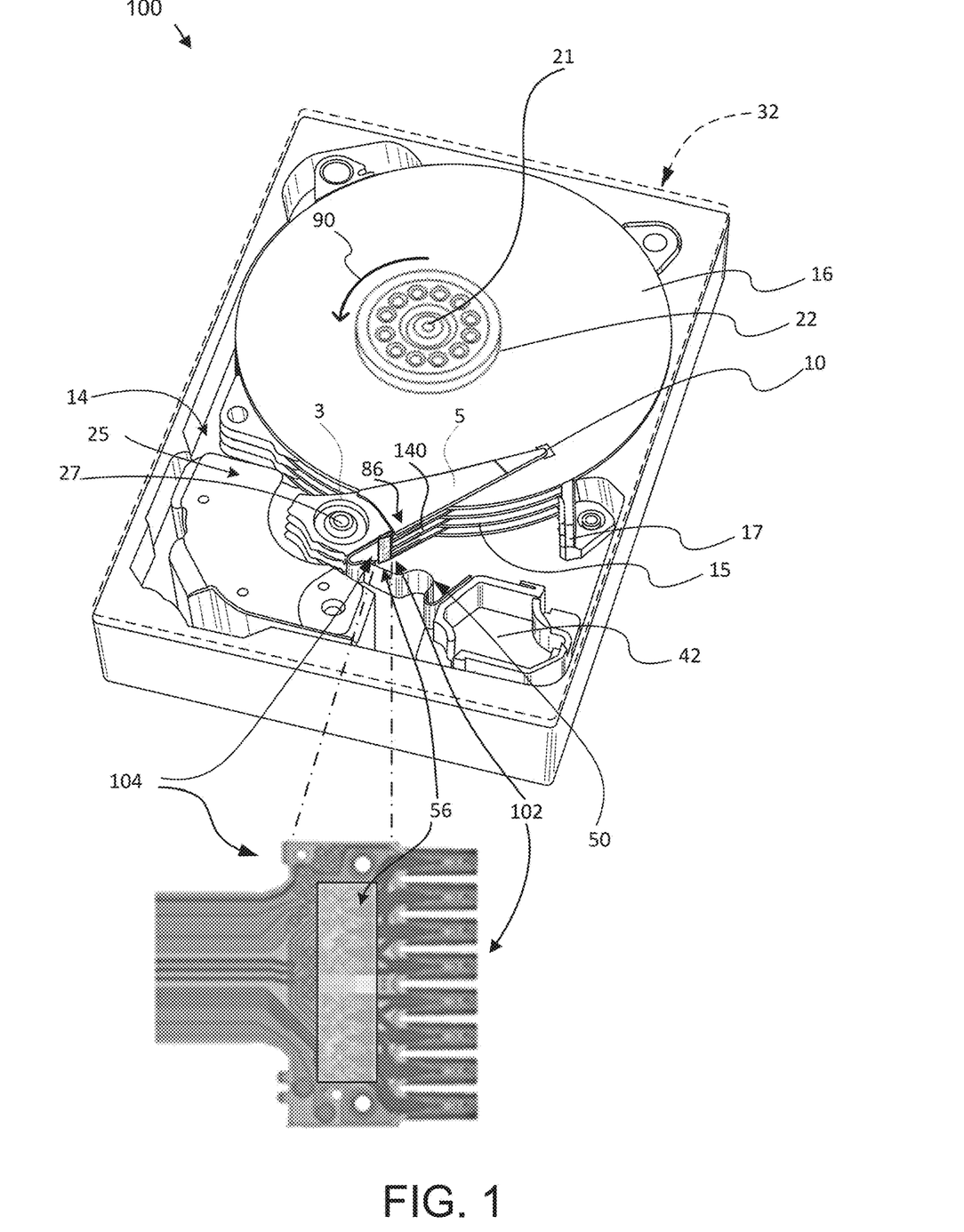
FIG. 1 is a perspective view of a hard disk drive having a multilayer flex circuit with a non-plated outer metal layer, according to one or more examples of the present disclosure.

FIG. 1 is a perspective view of a hard disk drive ("HDD") 100 having a multilayer flex circuit 104 with a non-plated outer metal layer. In some examples, the multilayer flex circuit 104 with the non-plated outer metal layer provides significant improvements to disk drive technology by enabling the non-plated outer metal layer of the multilayer flex circuit 104 to be more efficiently and reliably used. For example, in one example, the non-plated outer metal layer of the multilayer flex circuit 104 includes fine-pitch interconnects, e.g., traces that allow more connections for be included and pads for solder bumps to be used for connecting to a preamp 56 in a flip chip package for amplifying signals from a magnetic head of the HDD 100. Furthermore, various examples of other multilayer flex circuits with a non-plated outer metal layer may be used with many types of devices including HDDs, wearable devices such as watches, sensors, smart clothing, mobile communication devices such as smart phone, internet of things ("IoT") devices, and so forth.

In one example, the HDD 100 is depicted as a hard disk dive. In other examples, the HDD 100 could instead be one of any of various data storage or other electronic devices that use flexible circuits without departing from the essence of the subject matter of the present disclosure. The HDD 100 depicted includes a housing that hermetically seals or encloses an interior cavity 14 defined within the housing. The housing illustrated includes a base 30 and a cover 32 (shown in dashed lines so as not to obscure internal features of the HDD 100 within the interior cavity 14 of the housing). The cover 32 of the illustrated example is coupled to the base 30 to enclose the interior cavity 14 from the environment exterior to the housing. In some implementations, a seal or gasket is positioned between the base 30 and the cover to promote a seal between the base 30 and the cover.

The HDD 100 depicted in the example includes various features located within the interior cavity 14 of the housing. The HDD 100 includes a carriage 3, disks 15, a spindle motor 21, and a voice coil magnetic (VCM) actuator 25 within the interior cavity 14. The carriage 3 includes a plurality of arms 5 and at least one head-gimbal assembly (HGA) 10 coupled to the distal tip of each arm of the plurality of arms 5. Each HGA 10 includes at least one read-write head and at least one gimbal. The gimbal movably couples the read-write head to a respective arm 5. Although the HDD 100 is depicted as having five arms 5, one HGA 10 per side of each arm facing a disk 15 (e.g., bottom and top arms 5 have one HGA 10 and middle arms 5 have two HGAs 10), four disks 15, one spindle motor 21, and one VCM actuator 25, in other examples, different numbers of arms 5, HGAs 10, disks 15, spindle motors 21, and VCM actuators 25 are employed.

The spindle motor 21 is coupled to the base 30. Generally, the spindle motor 21 includes a stationary portion non-movably fixed relative to the base 30 and a spindle that is rotatable relative to the stationary portion and the base 30. Accordingly, the spindle of the spindle motor 21 is, considered in the example, to be part of or integral with the spindle motor. Generally, the spindle motor 21 is operable to rotate the spindle relative to the base 30. The disks 15, or platters, are co-rotatably fixed to the spindle of the spindle motor 21 through respective hubs 22, which are co-rotatably secured to respective disks 15 and the spindle. As the spindle of the spindle motor 21 rotates, the disks 15 correspondingly rotate. In this manner, the spindle of the spindle motor 21 defines a rotational axis of each disk 15. The spindle motor 21 is operatively controllable to rotate the disks 15, in a rotational direction 90, a controlled amount at a controlled rate.

Each of the disks 15 may be any of various types of magnetic recording media. In various examples, each disk 15 includes a substrate and a magnetic material applied directly or indirectly onto the substrate. Similarly, the magnetic material of the disks 15 may be conventional granular magnetic recording disks or wafers that have magnetic layer bits with multiple magnetic grains on each bit. In granular magnetic media, all of the bits are co-planar and the surface 16 of the disk is substantially smooth and continuous. In one example, each bit has a magnetic dipole moment that can either have an in-plane (longitudinal) orientation or an out-of-plane (perpendicular) orientation.

In the depicted example, as the disks 15 rotate in a read-write mode, the VCM actuator 25 electromagnetically engages voice coils of the respective arms 5 to rotate the arms 5, and the HGAs 10, which are coupled to the arms 5, relative to the disks 15 in a rotational direction along a plane parallel to read-write surfaces 16 of the disks 15. The arms 5 are rotated to position the read-write head of the HGAs 10 over a specified radial area of the read-write surface 16 of a respective disk 15 for read and/or write operations. The VCM actuator 25 is fixed to the base 30 in engagement with the voice coils of the arms 5, which are rotatably coupled to the base 30 by a spindle 27 extending through the base (not shown) of the carriage 3. The spindle 27 defines a rotational axis about which the arms 5 rotate when actuated by the VCM actuator 25.

The arms 5 are non-movably fixed to and extend away from the base (not shown) of the carriage 3 in a spaced-apart manner relative to each other. The arms 5 depicted are spaced an equal distance apart from each other and extend parallel relative to each other. In other examples different spacings are used. Individual disks 15 are positioned between adjacent arms 5. In an idle mode (e.g., when read-write operations are not being performed), the VCM actuator 25 is actuated to rotate the arms 5, in a radially outward direction relative to the disks 15, such that the HGAs 10 are parked or unloaded onto a ramp support 17 secured to the base 30.

Although not shown, the HDD 100 further includes a device control module, including software, firmware, and/or hardware, used to control operation of the various components of the HDD 100. In the illustrated example, the device control module includes a printed circuit board on or in which the hardware is mounted. In some examples, the device control module is electrically coupled to the VCM actuator 25 and the read-write heads of the HGAs 10, through one or more electrical communication signal transmission lines, to control operation of the HGAs 10. The electrical communication signal transmission lines facilitate the transmission of power, operational commands, and data between the device control module and the VCM actuator 25 and the read-write heads of the HGAs 10.

In the example illustrated, the electrical communication signal transmission lines are integrated into a flexible printed circuit board ("FPCB") 50. The FPCB 50 is coupled to a connector assembly 86. which is coupled to the carriage 3. More specifically, the connector assembly 86 includes a multilayer flex circuit 104, which is fixed onto the carriage 3. The FPCB 50 is flexible to allow the multilayer flex circuit 104 to remain non-movably fixed onto the carriage 3 rotates relative to the FPCB 50. In other words, as the carriage 3 rotates, the FPCB 50 flexes to accommodate the rotation of the carriage 3.

The transmission of power, commands, and data between the device control module and a respective HGA 10 is facilitated by an HGA connector 102 of the connector assembly 86 and an HGA tail 140. The HGA connector 102 is physically and electrically coupled with the multilayer flex circuit 104. The HGA tail 140 is electrically coupled with the HGA connector 102 and the HGA 10. Electrical signals are transmitted between the device control module and the HGA 10 via the electrical connections between the multilayer flex circuit 104, the HGA connector 102, and the HGA tail 140. To maintain operational control of the HGAs 10, the electrical connections of the connector assembly 86 (i.e., between at least the multilayer flex circuit 104 and the HGA connector 102) are strong and reliable.

Figure 2A:
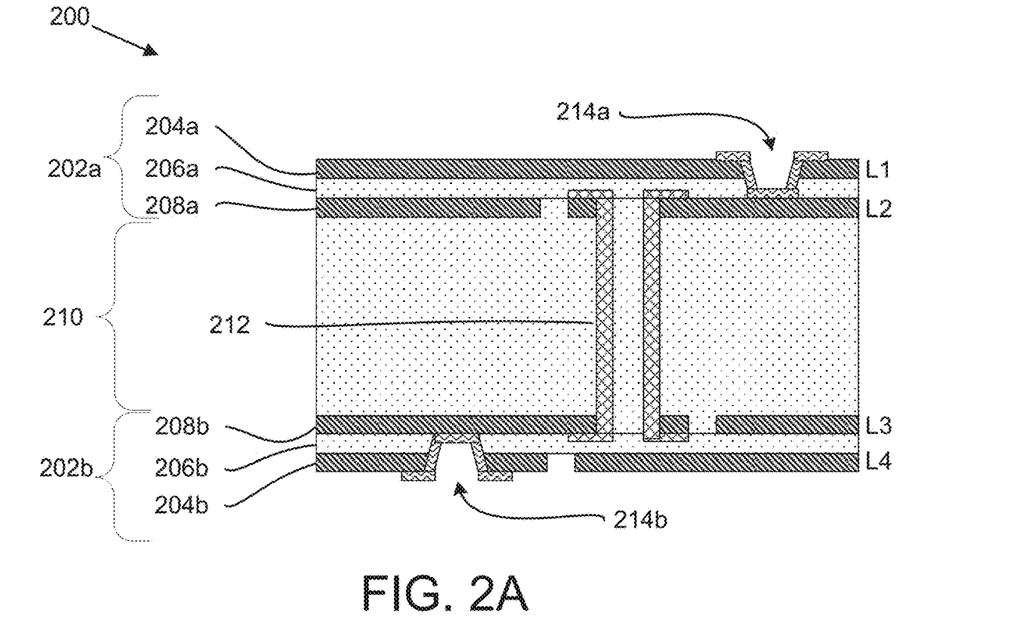
FIG. 2A is a cross-sectional side view of a multilayer flex circuit with four metal layers, according to one or more examples of the present disclosure.

FIG. 2A is a cross-sectional view of an example of multilayer flex circuit 200 with four metal layers e.g., L1, L2, L3, and L4. The multilayer flex circuit 200 depicted includes a first dual flex circuit 202a and a second dual flex circuit 202b that individually include an outer metal layer 204a, 204b, a base insulation layer 206a, 206b, and an inner metal layer 208a, 208b, where the base insulation layer 206a, 206b is disposed between the outer metal layer 204a, 204b and the inner metal layer 208a, 208b. The inner metal layer 208a of the first dual flex circuit 202a is configured to face toward the inner metal layer 208b of the second dual flex circuit 202b.

The multilayer flex circuit 200 further includes a coupling layer 210 having electrically conductive material 212 disposed between the inner metal layer 208a of the first dual flex circuit 202a and the inner metal layer 208b of the second dual flex circuit 202b. The multilayer flex circuit 200 also includes one or more blind vias that electrically connect the outer metal layer 204a of the second dual flex circuit 202b to the inner metal layer 208b of the second dual flex circuit 202b.

In one example, the electrically conductive material 212 material includes plating of a through-hole via to electrically connect the inner metal layer 208a (e.g., L2) of the first dual flex circuit 202a to the inner metal layer 208b (e.g., L3) of the second dual flex circuit 202b. In some examples, the coupling layer 210 includes adhesive between the inner metal layer 208a (e.g., L2) of the first dual flex circuit 202a and the inner metal layer 208b (e.g., L3) of the second dual flex circuit 202b to electrically and/or mechanically couple the first dual flex circuit 202a to the second dual flex circuit 202b.

In one example, the blind via 214a in the outer metal layer 204a (e.g. L1, that electrically connects to the inner metal layer 208a (e.g., L2) is also plated and thus has a greater thickness than another non-plated metal layer. Similarly, in some examples, the blind via 214b is plated. Such an example is suitable to accommodate traces and pads for mounting components that do not require fine-pitch interconnects or bump-on-via connections. Other examples are described below e.g., with respect to FIGS. 3A, 3B, 3C, 4A, 4C, in which an outer metal layer such as outer metal layer 204a is non-plated to provide for finer pitch traces and thinner pads without holes which are suitable for bump-on-via connections to be used, thus improving flexible connector and HDD technology.

Figure 2B:
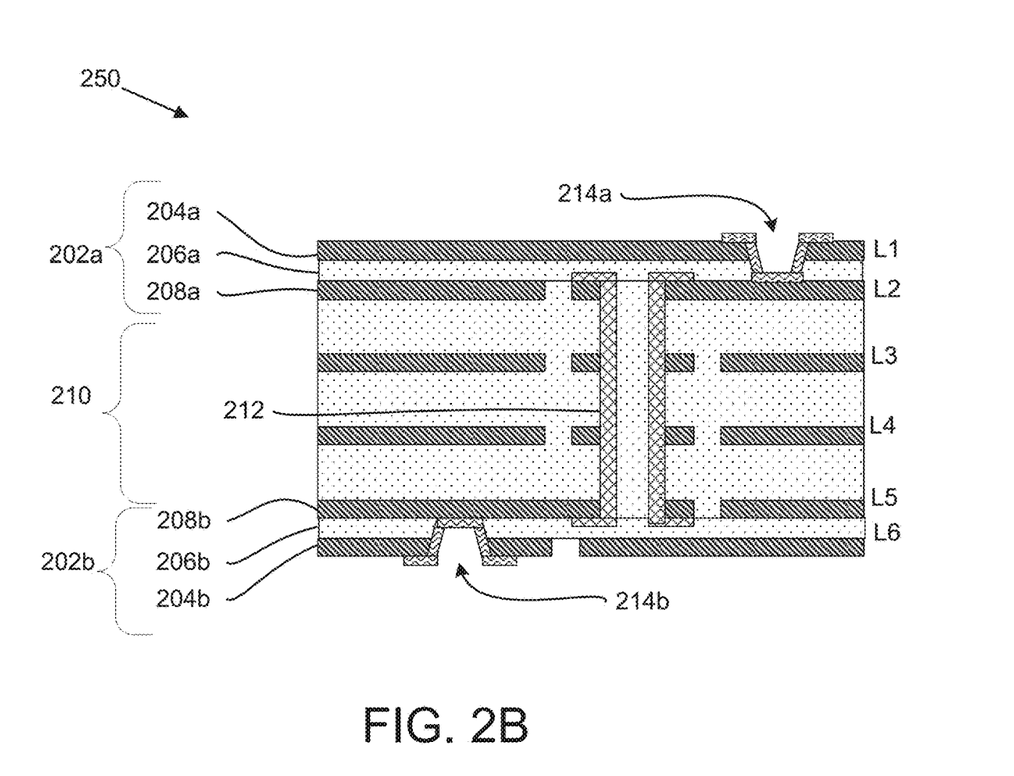
FIG. 2B is a cross-sectional side view of another multilayer flex circuit with six metal layers, according to one or more examples of the present disclosure.

FIG. 2B is a cross-sectional view of another example multilayer flex circuit 250 with six metal layers e.g., L1, L2, L3, L4, L5 and L6. The six-layer multilayer flex circuit 250 is configured substantially similarly to the four-layer multilayer flex circuit 200 depicted in FIG. 2A, except that in the six-layer multilayer flex circuit 250, additional metal layers (e.g., L3, L4) and/or insulation layers are included.

Some of the examples of multilayer flex circuits depicted throughout the present disclosure are described as including four or six metal layers. One of skill in the art will recognized that other examples of substantially similar multilayer flex circuits include more than four or six layers.

Figure 3A:
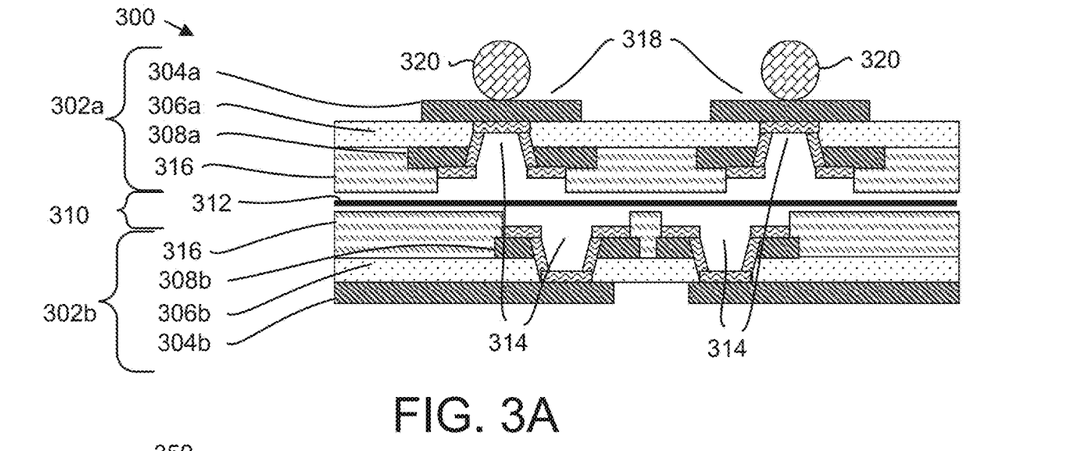
FIG. 3A is a cross-sectional side view of an improved multilayer flex circuit with two dual flex circuits, each with inner metal layers connected by an electrically conductive material in a coupling layer without inner bumps, according to one or more examples of the present disclosure.

FIG. 3A is a cross-sectional view of one example of an improved multilayer flex circuit 300 with first and second dual flex circuits 302a, 302b with a first outer metal layer e.g., 304a and/or 304b that is non-plated. In some examples only the outer metal layer 304a of the first dual flex circuit 302a is non-plated. In other examples, both outer metal layers e.g., 304a, 304b are non-plated. The inner metal layers 308a, 308b are configured to face each other and are adhesively coupled, in the example, by a coupling layer 310.

The first and second dual flex circuits 302a, 302b individually include a base insulation layer 306a, 306b where the base insulation layer 306a, 306b is disposed between the outer metal layer 304a, 304b and the inner metal layer 308a, 308b. In one example, the multilayer flex circuit 300 includes an electrically conductive material 312 of the coupling layer 310 that is disposed substantially in parallel to the inner metal layer 308a of the first dual flex circuit 302a and to the inner metal layer 308b of the second dual flex circuit 302b.

In such an example, the coupling layer 310 includes an electrically conductive material 312 such as an aluminum sheet, an anisotropic conductive film, a conductive adhesive, etc. For example, in one example, the conductive adhesive is injected between the first dual flex circuit and the second dual flex circuit. In other examples, the aluminum sheet or the anisotropic film are heated, laminated, and/or pressed between the first dual flex circuit and the second dual flex circuit.

In one example, the first dual flex circuit 302a and the second dual flex circuit 302b include an inner insulation layer 316 that electrically insulates portions of the inner metal layers 308a, 308b of the first and second dual flex circuits 302a, 302b which are not designed to be electrically connected together by the electrically conductive material 312. However, in certain examples, as shown in FIG. 3C, the first dual flex circuit 302a and the second dual flex circuit 302b do not include the inner insulation layer 316, which helps to improve the electrical connectivity between the inner metal layers 308a, 308b in certain cases.

In the example, the outer metal layer 304a of the first dual flex circuit 302a is non-plated and includes one or more hole-free surfaces 318 (e.g., pads) configured to electrically connect to the second dual flex circuit 302b through the coupling layer 310.

In some examples, the outer metal layer 304a of the first dual flex circuit 302a includes fine-pitch interconnects, e.g., traces. In various examples, the outer metal layer 304a, 304b and the inner metal layer 308a, 308b of the first dual flex circuit 302a and the second dual flex circuit 302b include one or more of copper, nickel, and silver.

In one example, the outer metal layer 304a of the first dual flex circuit 302a includes one or more hole-free surfaces 318 that are configured to directly electrically connect to one or more solder bumps 320. For example, in one example of an HDD, the one or more hole-free surfaces 318 are pads that are configured to directly electrically connect to solder bumps 320 of a component such as a preamp. Thus, the multilayer flex circuit 300 is suitable to implement Bump on Via ("BoV") without the disadvantages of holes in the outer metal layer, such as for example, uneven or weak mounting of the solder bumps 320 to the multilayer flex circuit 300 due to, for example, capillary action of the holes.

Figure 3B:
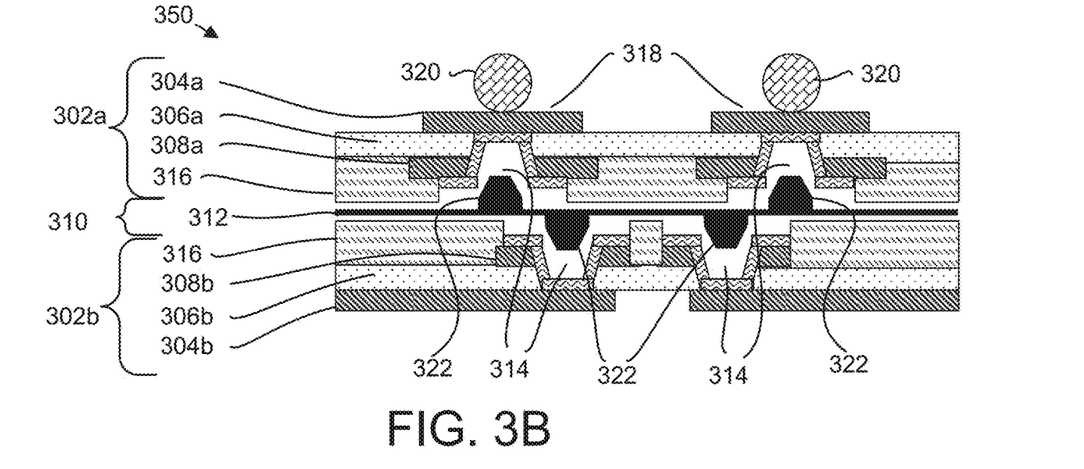
FIG. 3B is a cross-sectional view of another improved multilayer flex circuit with two dual flex circuits, each with inner metal layers connected by an electrically conductive material in a coupling layer with inner bumps, according to one or more examples of the present disclosure.
Figure 3C:
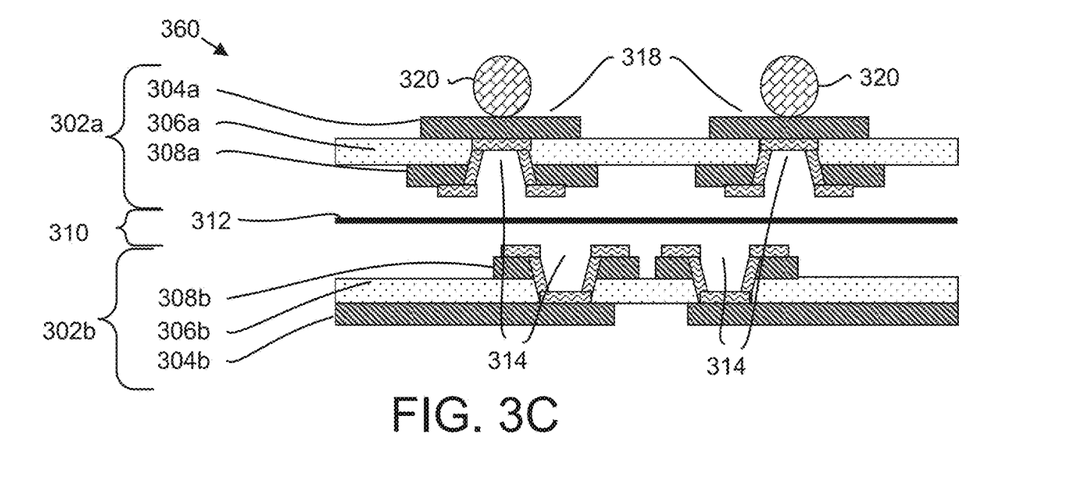
FIG. 3C is a cross-sectional side view of yet another improved multilayer flex circuit similar to the multilayer flex circuit of FIG. 3A, but without an inner insulation layer, according to one or more examples of the present disclosure.

FIG. 3B is a cross-sectional view of one example of an improved multilayer flex circuit 350 with two dual flex circuits with inner layers connected by a coupling layer 210 with inner bumps 322. The multilayer flex circuit 350 is, in one example, substantially similar to the multilayer flex circuit 300 depicted in FIG. 3A, except that the electrically conductive material 312 of the coupling layer 310 of multilayer flex circuit 350 includes one or more inner bumps 322 that extend from the electrically conductive material 312 of the coupling layer at least partially into the one or more buried vias 314. As used herein, the term "buried via" refers to a via that connects at least two metal layers and is not visible from the outer layers.

Figure 4A:
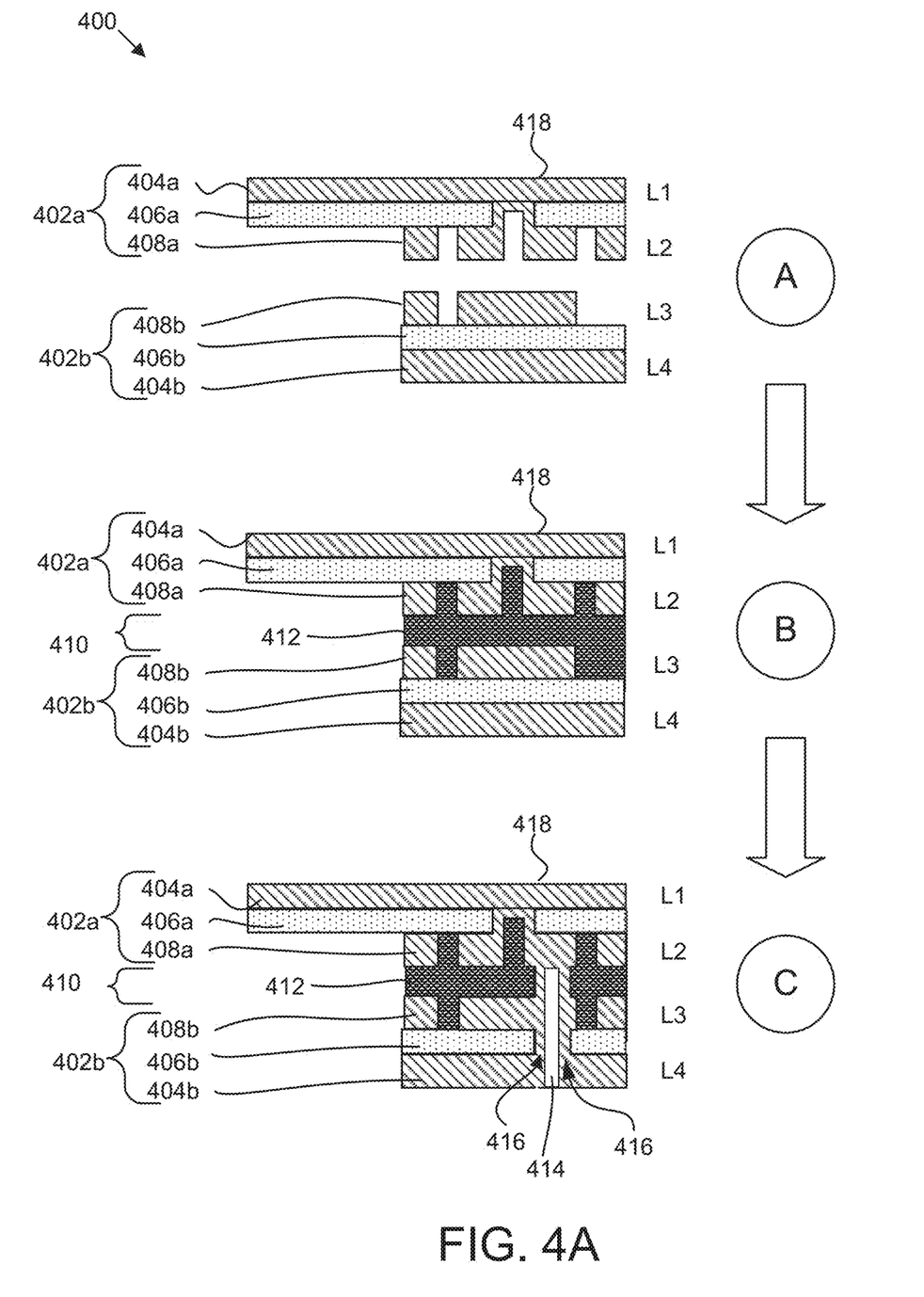
FIG. 4A is a cross-sectional view of a different improved multilayer flex circuit in which first and second dual flex circuit are coupled with non-conductive adhesive and a connection is established between the outer metal layer of the second dual flex circuit and one or more inner metal layers using a blind via, according to one or more examples of the present disclosure.

FIG. 4A is a cross-sectional view of another example of an improved multilayer flex circuit 400 in which first and second dual flex circuits 402a, 402b are coupled with non-conductive adhesive 412 and a connection is established between the outer metal layer 404b of the second dual flex circuit 402b and one or more inner metal layers e.g., 408b, 408a using a blind via. The first and second dual flex circuit 402a, 402b individually include an outer metal layer 404a, 404b, a base insulation layer 406a, 406b, and an inner metal layer 408a, 408b, where the base insulation layer 408 is disposed between the outer metal layer 404a, 404b in the inner metal layer 408a, 408b. The outer metal layer 404a of the first dual flex circuit 402a is non-plated and has a hole free surface 418 suitable for connecting to a bump on via or for including fine-pitch interconnects, e.g., traces.

At one stage of manufacturing "A," the first and second dual flex circuits 402a, 402b are formed in the inner metal layers 408a, 408b which are configured to face each other but are not yet adhesively coupled together.

At a next stage of manufacturing "B," the multilayer flex circuit 400 includes a coupling layer 410 with a non-conductive adhesive 412 that adhesively couples the inner metal layer 408a of the first dual flex circuit 402a to the inner metal layer 408b of the second dual flex circuit 402b. Because the non-conductive adhesive 412 does not electrically connect the inner metal layers 408a, 408b to each other, no inner insulation layer such as the inner insulation layer 316 which depicted in FIGS. 3A, 3B is needed. However, at stage "B," no electrical connection exists yet between the inner metal layer 408b of the second dual flex circuit 402b and the inner metal layer 408a of the first dual flex circuit 402a.

At a further stage of manufacturing "C," a blind via 414 is created to connect layers L4, L3, and L2 (which are also referred to respectively as the outer metal layer 404b and the inner metal layer 408b of the second dual flex circuit and inner metal layer 408a of the first dual flex circuit 402a). A via is a hole that is punched, drilled, laser cut, etc., and then plated e.g., with copper to form a connection between metal layers. Sometimes, the terms "blind via" is also referred to as a "blind via hole" or "BVH" even after the hole has been plated. As used herein, unless otherwise clear from context, the term "un-plated blind via hole" refers to a hole for a via before it is plated and the terms "blind via hole" and "blind via" refer to a plated hole that connects an outer metal layer to one or more inner metal layers and is referred to as "blind" because it is only visible on one side of the circuit.

The blind via 414 opens from the outer metal layer 404b of the second dual flex circuit 402b and extends upwards through the non-conductive adhesive 412. In various examples, the hole for the blind via 414 is punched, drilled or laser cut. An electrical connection 416 is then created between metal layers L4, L3, and L2, for example, by plating the hole for the blind via 414. Metal layers available for, L3, and L2 are also referred to as outer metal layer 404b, inner metal layer 408b, and inner metal layer 408a.

Figure 4B:
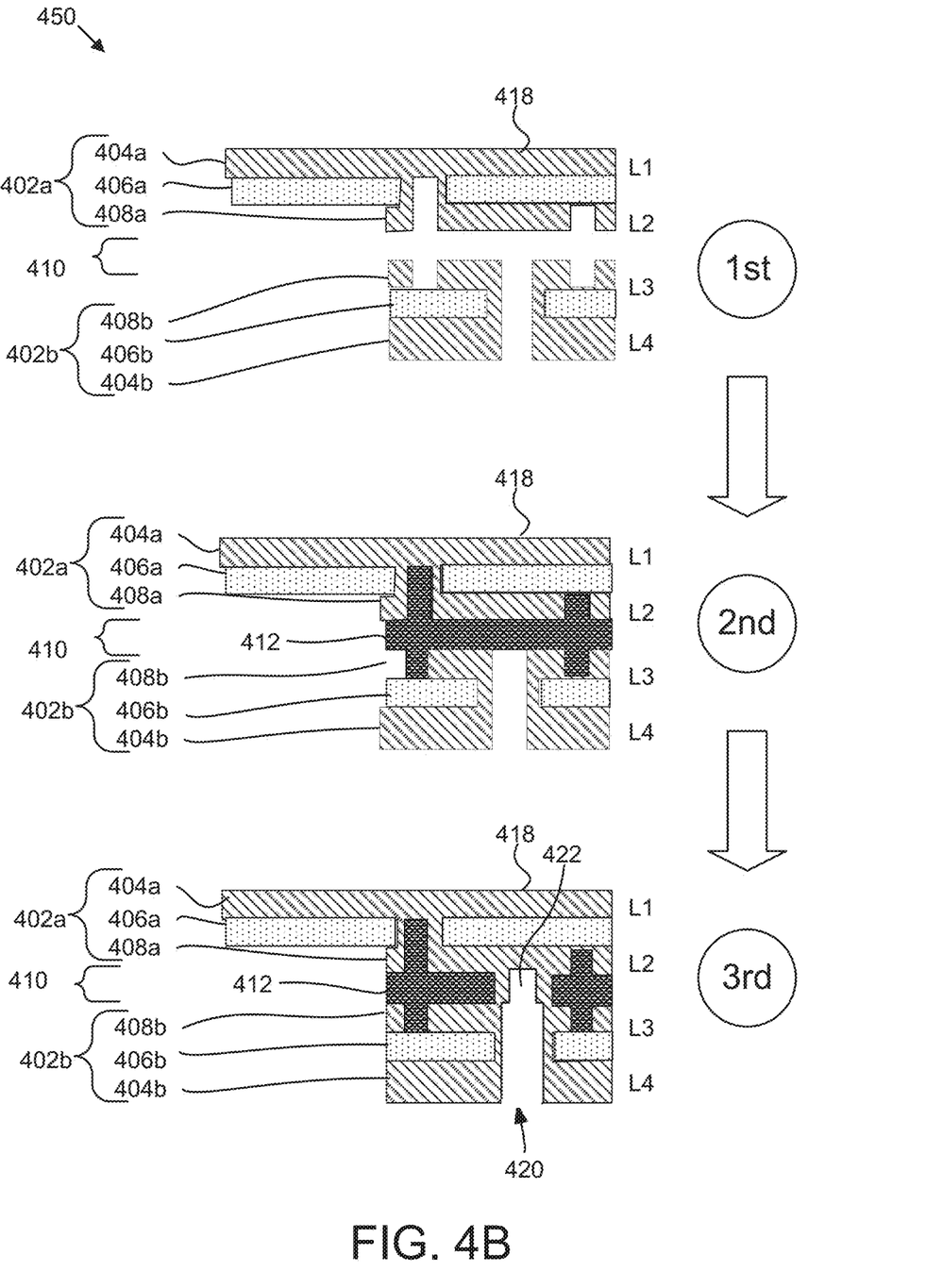
FIG. 4B is a cross-sectional view of another improved multilayer flex circuit in which first and second dual flex circuit are coupled with non-conductive adhesive and a connection is established between the outer and inner metal layers of the second dual flex circuit using a through-hole via and between the inner metal layers of the first and second dual flex circuits using a blind via, according to one or more examples of the present disclosure.

FIG. 4B is a cross-sectional view of a further example of an improved multilayer flex circuit 450 in which first and second dual flex circuit 402a, 402b are coupled with non-conductive adhesive 412, and a connection is established between the outer and inner metal layers 404b, 408b of the second dual flex circuit 402b using a through-hole via 420 and between the inner metal layers of the first and second dual flex circuits 408b, 408a using a blind via 422.

The multilayer flex circuit 450 is substantially similar to the multilayer flex circuit 400 described above with respect to FIG. 4A, except that at the manufacturing stage "C," rather than using a blind via like the blind via 414 described above with respect to FIG. 4A, in the example depicted of the multilayer flex circuit 450, layers L4 and L3 are connected by a through-hole via 420, and then layers L3 and L2 are connected by a blind via 422 made inside the through-hole via 420.

Figure 5:
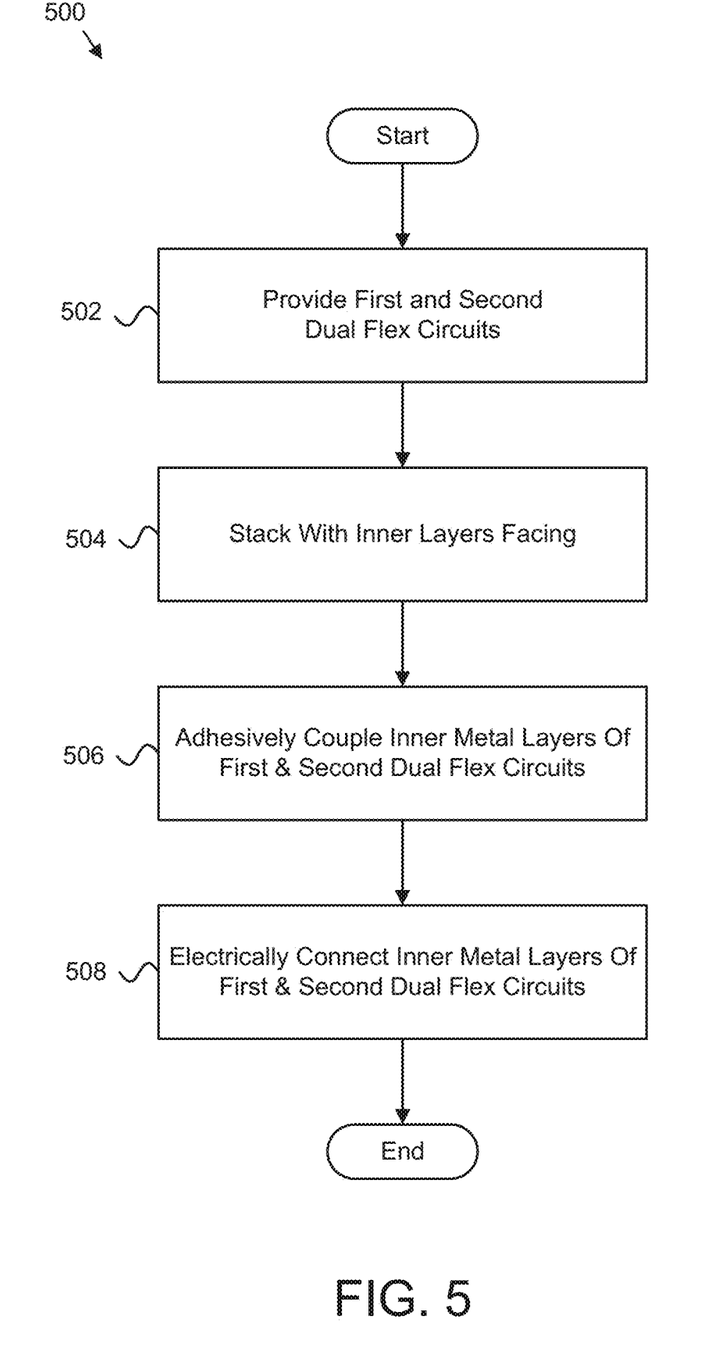
FIG. 5 is a schematic flow chart of a method of making a multilayer flex circuit with a non-plated outer metal layer, according to one or more examples of the present disclosure.

FIG. 5 is a schematic flow chart of a method 500 of making a multilayer flex circuit, according to one or more examples of the present disclosure. In one example, the method 500 begins and provides 502 a first dual flex circuit and a second dual flex circuit individually including an outer metal layer, an inner metal layer for connecting to another dual flex circuit, and a base insulation layer disposed between the outer metal layer and the inner metal layer. The method 500 continues and configures the inner metal layer of the first dual flex circuit to face toward the inner metal layer of the second dual flex circuit.

The method 500 continues and adhesively couples 506 the inner metal layer of first dual flex circuit to the inner metal layer of the second dual flex circuit. The method 500 continues and establishes an electrically connection between the inner metal layer of the first dual flex circuit and the inner metal layer of the second dual flex circuit. In certain examples, the method 500 is used to make a multilayer flex circuit substantially similar to the multilayer flex circuits 300, 350, 400, and 450 depicted respectively in FIGS. 3A, 3B, 4A, and 4B.

Figure 6:
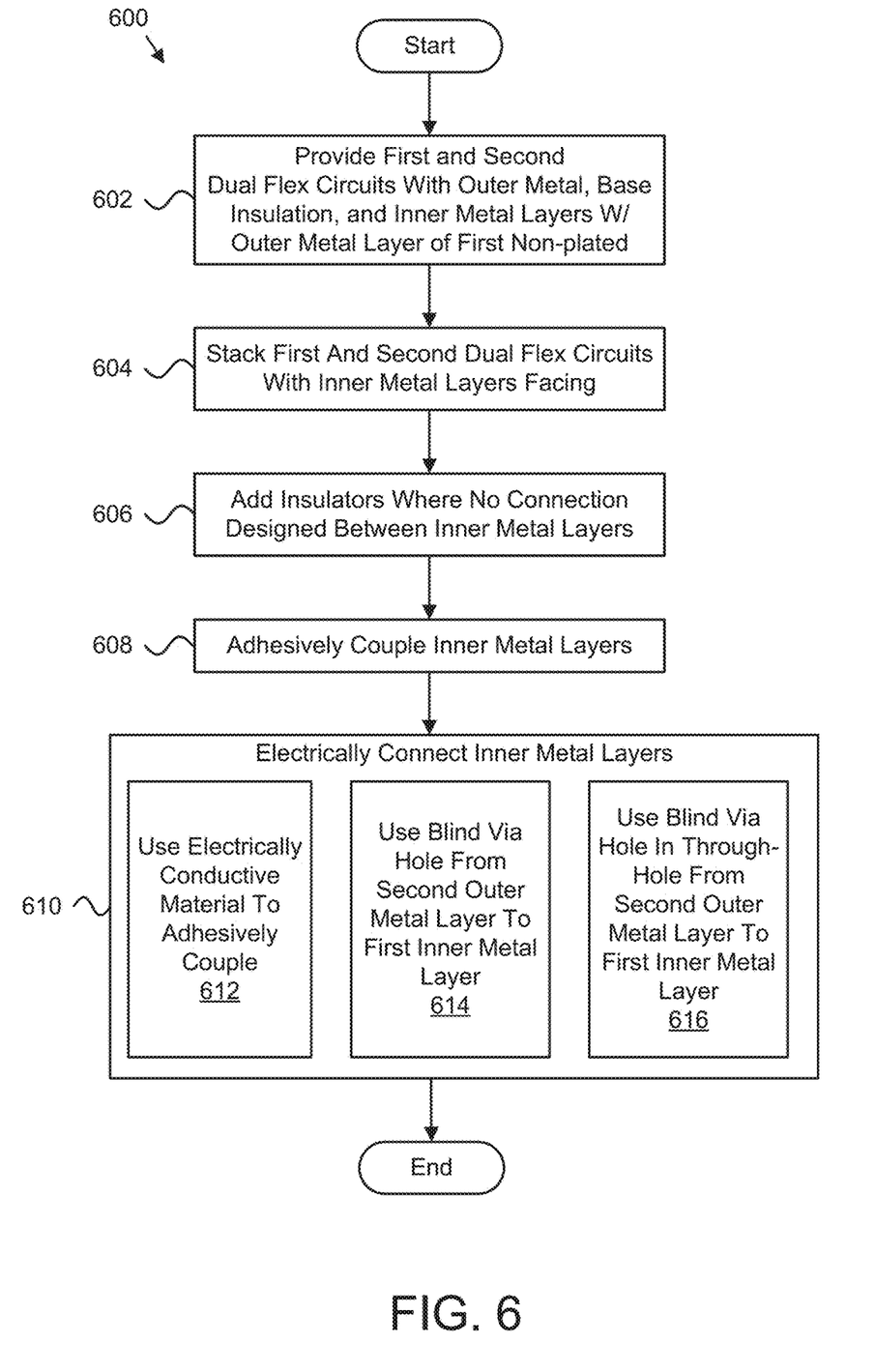
FIG. 6 is a schematic flow chart of another method of making a multilayer flex circuit with a non-plated outer metal layer, according to one or more examples of the present disclosure.

FIG. 6 is a schematic flow chart of another method 600 of making a multilayer flex circuit, according to one or more examples of the present disclosure. In one example, the method 600 begins and provides 602 a first dual flex circuit and a second dual flex circuit individually including an outer metal layer, an inner metal layer for connecting to another dual flex circuit, and a base insulation layer disposed between the outer metal layer and the inner metal layer. The method 600 continues and configures the inner metal layer of the first dual flex circuit to face toward the inner metal layer of the second dual flex circuit. The method 600 continues and adhesively couples 606 the inner metal layer of first dual flex circuit to the inner metal layer of the second dual flex circuit. The method 600 continues and establishes 610 an electrical connection between the inner metal layer of the first dual flex circuit and the inner metal layer of the second dual flex circuit, and the method 600 ends.

In one example, establishing 610 the electrical connection includes adhesively coupling 608 the inner metal layer of first dual flex circuit to the inner metal layer of the second dual flex circuit using 612 an electronically conductive material.

In another example, establishing 610 the electrical connection includes using 614 a blind via to connect the outer and inner metal layers of the second dual flex circuit to the inner metal layer of the first dual flex circuit.

In a different example, establishing 610 the electrical connection includes using 616 a through-hole via to connect the outer and inner metal layers of the second dual flex circuit and using 618 a blind via to connect the inner metal layer of the second dual flex circuit to the inner metal layer of the first dual flex circuit.

In certain examples, the method 600 is used to make a multilayer flex circuit substantially similar to the multilayer flex circuits 300, 350, 400, and 450 depicted respectively in FIGS. 3A, 3B, 4A, and 4B.

In the above description, certain terms may be used such as "up," "down," "upper," "lower," "horizontal," "vertical," "left," "right," "over," "under" and the like. These terms are used, where applicable, to provide some clarity of description when dealing with relative relationships. But, these terms are not intended to imply absolute relationships, positions, and/or orientations. For example, with respect to an object, an "upper" surface can become a "lower" surface simply by turning the object over. Nevertheless, it is still the same object. Further, the terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise. Further, the term "plurality" can be defined as "at least two." Moreover, unless otherwise noted, as defined herein a plurality of particular features does not necessarily mean every particular feature of an entire set or class of the particular features.

Additionally, instances in this specification where one element is "coupled" to another element can include direct and indirect coupling. Direct coupling can be defined as one element coupled to and in some contact with another element. Indirect coupling can be defined as coupling between two elements not in direct contact with each other, but having one or more additional elements between the coupled elements. Further, as used herein, securing one element to another element can include direct securing and indirect securing. Additionally, as used herein, "adjacent" does not necessarily denote contact. For example, one element can be adjacent another element without being in contact with that element.

As used herein, the phrase "at least one of", when used with a list of items, means different combinations of one or more of the listed items may be used and only one of the items in the list may be needed. The item may be a particular object, thing, or category. In other words, "at least one of" means any combination of items or number of items may be used from the list, but not all of the items in the list may be required. For example, "at least one of item A, item B, and item C" may mean item A; item A and item B; item B; item A, item B, and item C; or item B and item C. In some cases, "at least one of item A, item B, and item C" may mean, for example, without limitation, two of item A, one of item B, and ten of item C; four of item B and seven of item C; or some other suitable combination.

Unless otherwise indicated, the terms "first," "second," etc. are used herein merely as labels, and are not intended to impose ordinal, positional, or hierarchical requirements on the items to which these terms refer. Moreover, reference to, e.g., a "second" item does not require or preclude the existence of, e.g., a "first" or lower-numbered item, and/or, e.g., a "third" or higher-numbered item.

As used herein, a system, apparatus, structure, article, element, component, device, or hardware "configured to" perform a specified function is indeed capable of performing the specified function without any alteration, rather than merely having potential to perform the specified function after further modification. In other words, the system, apparatus, structure, article, element, component, device, or hardware "configured to" perform a specified function is specifically selected, created, implemented, utilized, programmed, and/or designed for the purpose of performing the specified function. As used herein, "configured to" denotes existing characteristics of a system, apparatus, structure, article, element, component, device, or hardware which enable the system, apparatus, structure, article, element, component, device, or hardware to perform the specified function without further modification. For purposes of this disclosure, a system, apparatus, structure, article, element, component, device, or hardware described as being "configured to" perform a particular function may additionally or alternatively be described as being "adapted to" and/or as being "operative to" perform that function.

The schematic flow chart diagrams included herein are generally set forth as logical flow chart diagrams. As such, the depicted order and labeled steps are indicative of one example of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagrams, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

The present subject matter may be embodied in other specific forms without departing from its spirit or essential characteristics. The described examples are to be considered in all respects only as illustrative and not restrictive. Examples of the scope of the present subject matter can be found in the following numbered paragraphs.

What is claimed is:

1. A multilayer flex circuit, comprising:
    a first dual flex circuit and a second dual flex circuit, each individually comprising:
        an outermost layer that is an outer metal layer;
        an inner metal layer;
        a plurality of blind vias or blind via holes that are open on an inner end and closed on an outer end for receiving a quantity of adhesive for coupling the first dual flex circuit to the second dual flex circuit and
        a base insulation layer disposed between the outer metal layer and the inner metal layer, wherein:
            for the first dual flex circuit, the outer metal layer is a non-plated metal layer that excludes any thickness of plating material on the outer surface; and
            the inner metal layer of the first dual flex circuit is configured to face toward the inner metal layer of the second dual flex circuit;
    a coupling layer comprising:
        an adhesive that is received into inward facing openings of the blind via holes for adhesively coupling the first dual flex circuit to the second dual flex circuit; and
        an electrically conductive material that electrically connects the inner metal layer of the second dual flex circuit to the inner metal layer of the first dual flex circuit.

2. The multilayer flex circuit of claim 1, wherein the non-plated outer metal layer of the first dual flex circuit comprises fine-pitch interconnects.

3. The multilayer flex circuit of claim 1, wherein the non-plated outer metal layer of the first dual flex circuit comprises one or more hole-free outer pad surfaces configured to electrically connect to the second dual flex circuit through the coupling layer.

4. The multilayer flex circuit of claim 3, wherein the one or more hole-free surfaces of the first dual flex circuit are further configured to directly electrically connect to corresponding solder bumps of a high bump density component using bump on via ("BoV") connections.

5. The multilayer flex circuit of claim 4, wherein the one or more hole-free surfaces on which the bump on via connections are made are vertically aligned with corresponding blind vias that, after adhesively coupling of the first and second dual flex circuits, serve as buried vias that extend from the inner metal layer through the base insulation layer to the inner surface of the hole-free surfaces.

6. The multilayer flex circuit of claim 5, wherein the coupling layer comprises an electrically conductive material that is disposed substantially in parallel to the inner metal layer of the first dual flex circuit and to the inner metal layer of the second dual flex circuit.

7. The multilayer flex circuit of claim 5, further comprising one or more inner bumps that extend from the electrically conductive material of the coupling layer at least partially into the inward facing openings of the one or more buried vias.

8. The multilayer flex circuit of claim 2, wherein:
    the coupling layer comprises a non-conductive adhesive; and
    the inner metal layer of the first dual flex circuit is electrically connected to the inner metal layer of the second dual flex circuit by electrically conductive material that extends through the non-conductive adhesive of the coupling layer.

9. The multilayer flex circuit of claim 8, further comprising one or more blind vias that electrically connect the outer metal layer and the inner metal layer of the second dual flex circuit to the inner metal layer of the first dual flex circuit.

10. The multilayer flex circuit of claim 8, further comprising:
    a through-hole via that electrically connects the outer metal layer of the second dual flex circuit to the inner metal layer of the second dual flex circuit; and
    a blind via that extends from the through-hole via and electrically connects the inner metal layer of the second dual flex circuit to the inner metal layer of the first dual flex circuit.

11. The multilayer flex circuit of claim 1, wherein the electrically conductive material adhesively couples the first dual flex circuit to the second dual flex circuit.

12. The multilayer flex circuit of claim 1, wherein the first dual flex circuit and the second dual flex circuit individually further comprise an inner insulation layer coupled to the inner metal layer.

13. The multilayer flex circuit of claim 1, wherein the electrically conductive material comprises one or more of an aluminum sheet, an anisotropic conductive film, and a conductive adhesive.

14. The multilayer flex circuit of claim 1, wherein the outer metal layer and the inner metal layer of the first dual flex circuit and the second dual flex circuit comprise one or more of copper, nickel, and silver.

15. The multilayer flex circuit of claim 1, wherein the base insulation layer of the first dual flex circuit and the second dual flex circuit comprises one or more of polyimide, polyether ether ketone, polyester, polyethylene terephthalate, and flexible silicon.

16. A method comprising:
   providing a first dual flex circuit and a second dual flex circuit individually comprising:
      an outer metal layer, wherein the outer metal layer of the first dual flex circuit is a non-plated metal layer which excludes any thickness of plating material on the outer surface;
      an inner metal layer for connecting to another dual flex circuit;
      a plurality of blind vias or blind via holes that are open at an inner end and closed at an outer end for receiving a quantity of adhesive for coupling the first dual flex circuit to the second dual flex circuit; and
      a base insulation layer disposed between the outer metal layer and the inner metal layer,
   configuring the inner metal layer of the first dual flex circuit to face toward the inner metal layer of the second dual flex circuit;
   adhesively coupling the first dual flex circuit to the second dual flex circuit by filling inward facing openings of the blind vias or blind via holes; and
   establishing an electrical connection between the inner metal layer of the second dual flex circuit and the inner metal layer of the first dual flex circuit.

17. The method of claim 16, wherein the step of establishing the electrical connection comprises adhesively coupling the inner metal layer of the first dual flex circuit to the inner metal layer of the second dual flex circuit using an electronically conductive material.

18. The method of claim 16, wherein the step of establishing the electrical connection comprises creating a plated blind via that connects the outer metal layer and the inner metal layer of the second dual flex circuit to the inner metal layer of the first dual flex circuit.

19. The method of claim 16, wherein the step of establishing the electrical connection comprises:
   creating a through-hole via that connects the outer metal layer and the inner metal layer of the second dual flex circuit; and
   creating a blind via that connects the inner metal layer of the second dual flex circuit to the inner metal layer of the first dual flex circuit.

20. A storage device comprising:
   a multilayer flex circuit that comprises a first dual flex circuit and a second dual flex circuit, the first dual flex circuit and the second dual flex circuit individually comprising:
      an outer metal layer, wherein the outer metal layer of the first dual flex circuit is a non-plated metal layer which excludes any thickness of plating material on the outer surface;
      a base insulation layer;
      an inner metal layer; and
      a plurality of via holes that are open on an inner end and closed on an outer end for receiving a quantity of adhesive for coupling the first dual flex circuit to the second dual flex circuit;
      wherein the base insulation layer is disposed between the outer metal layer and the inner metal layer, and
      wherein the inner metal layer of the first dual flex circuit is configured to face toward the inner metal layer of the second dual flex circuit;
   a coupling layer comprising:
      an adhesive that is received into inward facing openings of the via holes for adhesively coupling the first dual flex circuit to the second dual flex circuit; and;
      an electrically conductive material that electrically connects the inner metal layers of the second dual flex circuit to the inner metal layer of the first dual flex circuit.

* * * * *